US009608568B2

(12) United States Patent
Ro et al.

(10) Patent No.: US 9,608,568 B2
(45) Date of Patent: Mar. 28, 2017

(54) TRANSCONDUCTANCE OPTIMIZATION USING FEEDBACK-BALUN-TRANSFORMER WITH INDUCTANCE DEGENERATION COMBINATIONS

(71) Applicant: Futurewei Technologies, Inc., Plano, TX (US)

(72) Inventors: Yoonhyuk Ro, Gainesville, FL (US); Xuya Qiu, High Point, NC (US); Jamil Forrester, Summerfield, NC (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/638,874

(22) Filed: Mar. 4, 2015

(65) Prior Publication Data

US 2016/0261234 A1    Sep. 8, 2016

(51) Int. Cl.
  *H03F 1/02*    (2006.01)
  *H03F 3/16*    (2006.01)
  *H03F 3/45*    (2006.01)

(52) U.S. Cl.
  CPC ............ *H03F 1/0205* (2013.01); *H03F 3/16* (2013.01); *H03F 2200/117* (2013.01); *H03F 2200/489* (2013.01)

(58) Field of Classification Search
  USPC .................................. 330/252–261, 301, 283
  See application file for complete search history.

(56) References Cited

U.S. PATENT DOCUMENTS 7,489,192 B2* 2/2009 Vitzilaios .................. H03F 1/26
  330/283
8,576,005 B2* 11/2013 Liao ........................ H04B 1/52
  330/253

* cited by examiner

*Primary Examiner* — Hieu Nguyen
(74) *Attorney, Agent, or Firm* — Schwegman Lundberg & Woessner, P.A.

(57) ABSTRACT

Disclosed are apparatuses and methods to overcome technology limitations to achieve linearity and efficiency performance suitable for practical wireless communications systems. In an embodiment, an amplifier is provided that superimposes the transconductance from a common source amplifier with inductor degeneration with the transconductance from a common source amplifier without degeneration. In an embodiment, an amplifier is provided having a feedback-balun-transformer that provides electro-magnetic coupling between primary, secondary, and negative feedback degeneration inductors and a differential to single-ended conversion output.

15 Claims, 12 Drawing Sheets

TRANSCONDUCTANCE OPTIMIZATION USING FEEDBACK-BALUN-TRANSFORMER WITH INDUCTANCE DEGENERATION COMBINATIONS

TECHNICAL FIELD

This disclosure is generally directed to transconductance optimization and more particularly to transconductance optimization using balun transformer feedback with inductance degeneration combinations.

BACKGROUND

A variable-gain amplifier (VGA) is an amplifier that varies its gain depending on a control voltage. A transconductance amplifier (a.k.a. $g_m$ amplifier) puts out a current proportional to its input voltage. The transconductance of a MOSFET transistor is the change in its drain current divided by the small change in the gate/source voltage with a constant drain/source voltage.

There are a variety of known techniques to improve the linearity of amplifiers. For example, one technique has been to combine PFET and NFET amplifier topologies thereby superposing their transconductances on one another. This technique tends to be bandwidth-limited because of the characteristics of the PFET.

Another technique, known as derivative superposition, combines saturation-region-biased FETs and triode-region-biased FETs. This technique requires different device sizes and gate bias voltages for the saturation-region-biased FETs and the triode-region-biased FETs. In addition, the area and current for the triode-region-biased FETs do not contribute to gain since the primary purpose of triode-region-biased FETs is to improve linearity.

Yet another technique is to introduce negative feedback using inductor degeneration to linearize the transconductance of amplifier.

Referring to FIG. 1, a schematic is illustrated of a prior art technique to improve the linearity in a low noise amplifier (LNA). A differential feedback-transformer has electro-magnetic coupling between its primary inductors 102a and 102b and its degeneration inductors 104a and 104b, respectively, to provide negative feedback.

FIG. 2 illustrates a simplified layout of the differential feedback-transformer depicted in FIG. 1. Notably, an additional balun transformer is required to acquire a single-ended output signal from the differential output $V_{out}$ in circuit 100 of FIG. 1, thus requiring additional integrated circuit area.

SUMMARY

According to an embodiment of the present disclosure, an amplifier is provided that superimposes the transconductance from a common source amplifier with inductor degeneration with the transconductance from a common source amplifier without degeneration, making optimization possible for both linearization and conversion efficiency.

According to an embodiment of the present disclosure, an amplifier is provided having a feedback-balun-transformer that provides electro-magnetic coupling between primary, secondary, and degeneration inductors and a differential to single-ended output conversion, conserving substantial integrated circuit die area. The degeneration inductors are integrated within intertwined primary and secondary inductors thereby providing a much wider range of degeneration. The amount of degeneration can be independently adjusted either with the number of degeneration inductor turns and/or by adjusting the distance from the degeneration inductors to intertwined primary and secondary inductors.

Other technical features may be readily apparent to one skilled in the art from the following figures, descriptions, and claims.

DETAILED DESCRIPTION

The detailed description set forth below is intended as a description of exemplary designs of the present disclosure and is not intended to represent the only designs in which the present disclosure can be practiced. It should be appreciated, however, that the present disclosure provides many applicable inventive concepts that can be embodied in a wide variety of specific contexts. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Unless defined otherwise, all technical and scientific terms used herein have the same meaning as commonly understood by those of skill in the art to which this disclosure pertains.

Various circuits or other components may be described or claimed as "configured to" perform a task or tasks. In such contexts, "configured to" is used to connote structure by indicating that the circuits/components include structure (e.g., circuitry) that performs the task or tasks during operation. As such, the circuit/component can be said to be configured to perform the task even when the specified circuit/component is not currently operational (e.g., is not on). The circuits/components used with the "configured to" language include hardware—for example, circuits to implement the operation, etc. Reciting that a circuit/component is "configured to" perform one or more tasks is expressly intended not to invoke 35 U.S.C. 112 (f).

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Figure 3:
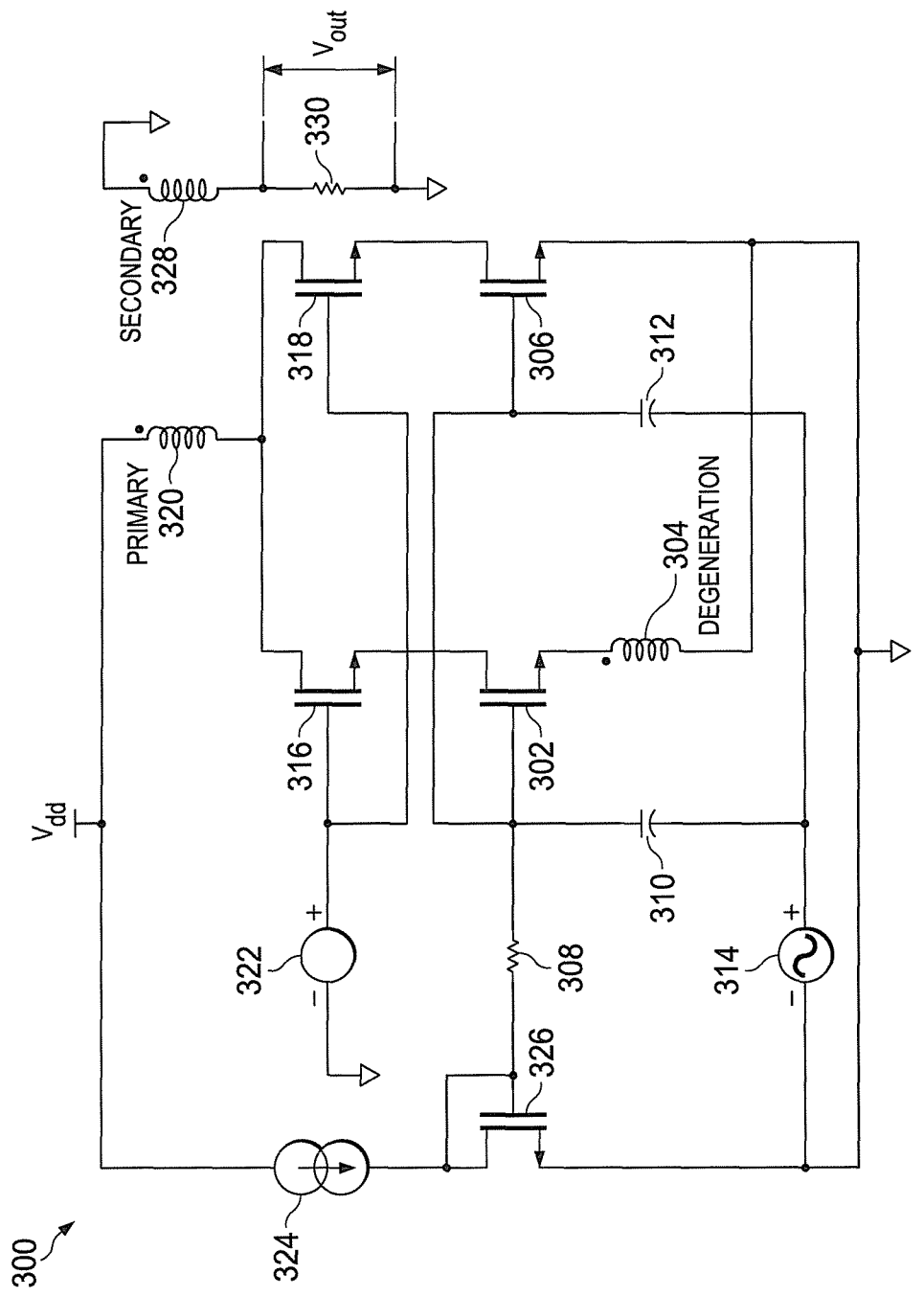
FIG. 3 illustrates a schematic of an apparatus with transconductance optimization by combining a common source amplifier with degeneration and a common source amplifier without degeneration, in accordance with principles of the present invention.

Reference is now made to FIG. 3 that illustrates an amplifier 300 with transconductance optimization by superimposing the transconductance from a common source amplifier with inductor degeneration with the transconductance from a common source amplifier without degeneration. Amplifier 300 comprises an N-channel transistor 302 having its source coupled through a degeneration inductor 304 to the negative power supply rail (e.g. ground), coupled in parallel (i.e. superimposed) with an N-channel transistor 306 having its source coupled directly to the negative power supply rail (i.e. does not have source degeneration). The gates of transistors 302 and 306 are coupled together, to one end of resistor 308, and respectively through AC coupling capacitors 310 and 312 to a signal source 314. In an embodiment, the signal source 314 may be an output of a mixer.

The drains of transistors 302 and 306 are respectively coupled to the sources of N-channel transistors 316 and 318. The gates of N-channel transistors 316 and 318 are coupled together and to bias voltage 322. The drains of N-channel transistors 316 and 318 are coupled together and through primary inductor 320 to the positive supply rail (e.g. $V_{dd}$). A current source 324 is coupled to the drain and gate of N-channel transistor 326 and to the opposite end of resistor 308. Since the drain and gate of N-channel transistor 326 are coupled together, transistor 326 operates as a forward-biased diode providing a constant bias voltage at the end of resistor 308. The primary inductor 320 induces a voltage across secondary inductor 328 through electro-magnetic coupling that produces a single-ended output voltage $V_{out}$ across resistor 330.

Linearization is provided by the common source amplifier 302 and degeneration inductor 304 and conversion efficiency (from gate voltage to drain current) is provided from common source amplifier 306. Accordingly, the superposition of two source amplifiers 302 and 306 provides both linearized transconductance and efficient voltage-to-current conversion. Moreover, the same size and gate bias voltages can be used for both amplifiers 302 and 306 simplifying the design process.

Applicants have verified the amplifier 300 depicted in FIG. 3 by harmonic balance simulations. The performance of amplifier 300 was compared to a VGA having only inductor degeneration and to a VGA without degeneration. The linearity and conversion efficiency of each circuit was simulated and verified.

The transconductance at an output frequency of 1.91 GHz, output power, third order intermodulation (IM3), and current consumption of all three circuits are compared at the same output power in Table 1 below.

TABLE 1

Performance Comparison At 1.91 GHz Output Frequency

| Parameter | Amplifier 300 | VGA with inductor degeneration | VGA without degeneration |
| --- | --- | --- | --- |
| Gm [m℧] | 53.12 | 51.57 | 51.34 |
| Pout [dBm] | 2.92 | 2.83 | 2.72 |
| IM3 [dBc] | 31.37 | 33.27 | 26.78 |
| $I_{dd}$ [mA] | 19.57 | 23.36 | 17.46 |

The simulation results show that linearity (IM3) of amplifier 300 depicted in FIG. 3 is approximately 4.6 dBc better than VGA without degeneration and the current consumption of amplifier 300 is about 3.8 mA less than the VGA with inductor degeneration. Alternatively stated, the superposition of two common-source amplifiers (with inductor degeneration and without degeneration) provides benefits of linearized transconductance and efficient voltage-to-current conversion.

Figure 4:
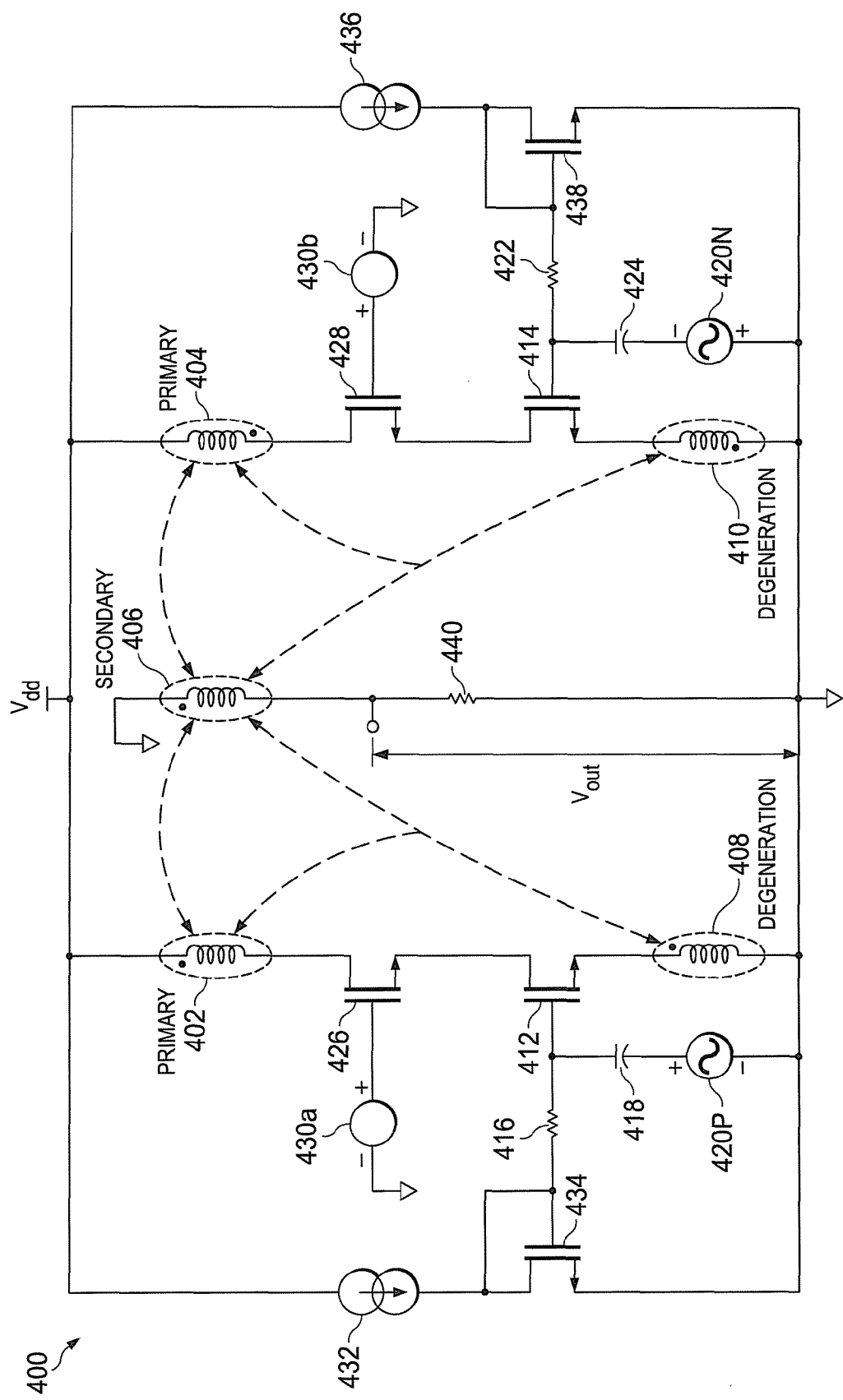
FIG. 4 illustrates a schematic of an apparatus with combined electro-magnetic couplings between primary and secondary balun transformer inductors and degeneration feedback inductors, in accordance with principles of the present disclosure.

Reference is now made to FIG. 4 that illustrates an embodiment of an amplifier 400 having combined primary, secondary, and feedback degeneration inductors. An amplifier 400 employs a feedback-balun-transformer with integrated degeneration inductors. As described in more detail below, the feedback-balun-transformer with integrated degeneration inductors hereinafter simply referred to as "feedback-balun-transformer" (collectively, element 500 in FIG. 5) comprises primary inductors 402 and 404, secondary inductor 406, and degeneration inductors 408 and 410. The feedback-balun-transformer 500 supplies the negative feedback degeneration as well as provides a differential to single-ended output, saving substantial integrated circuit area. As depicted in FIG. 4, amplifier 400 provides electro-magnetic coupling between: the first primary inductor 402 and secondary inductor 406; the first primary inductor 402 and the first degeneration inductor 408; the first degeneration inductor 408 and the secondary inductor 406; the second primary inductor 404 and the secondary inductor 406; the second primary inductor 404 and the second degeneration inductor 410; and the second degeneration inductor 410 and the secondary inductor 406.

Figure 1:
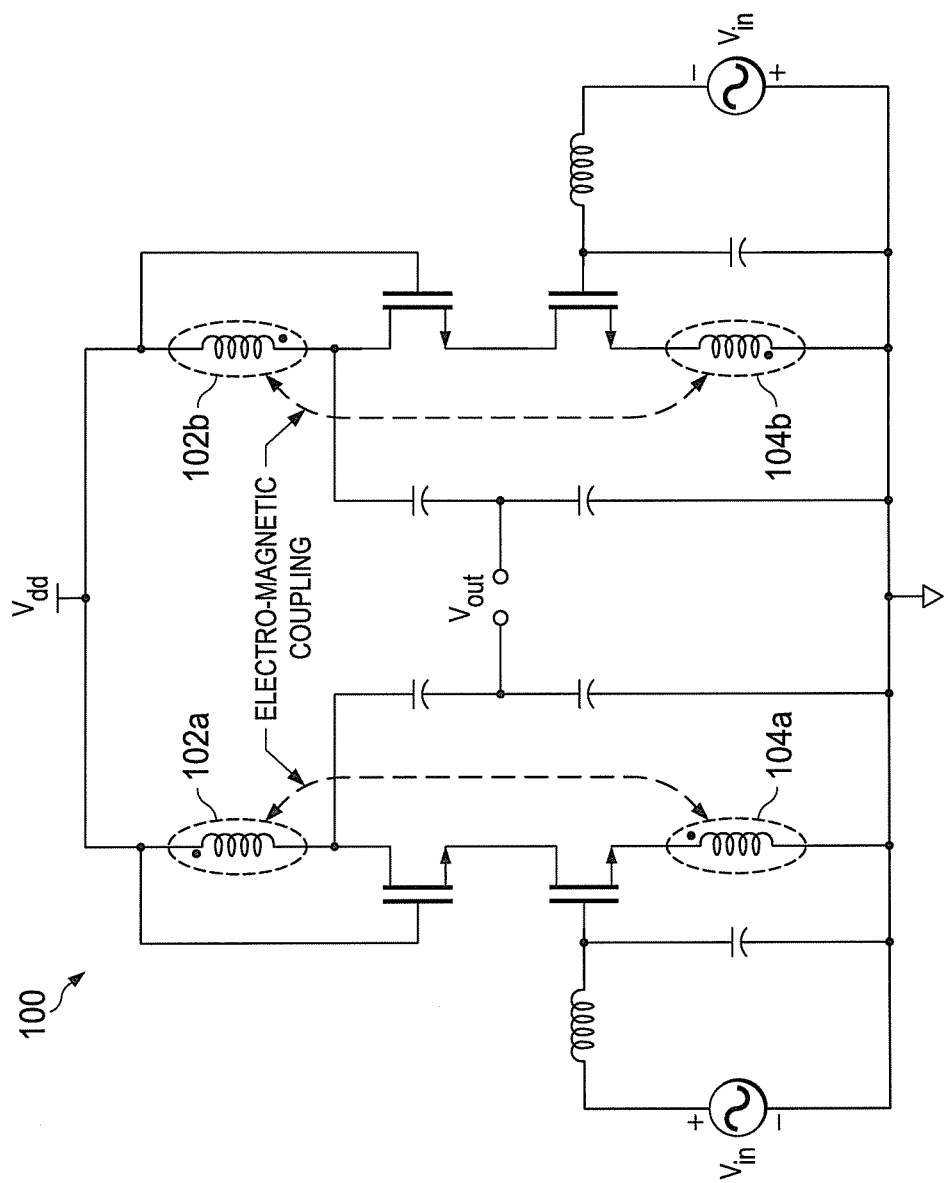
FIG. 1 illustrates a schematic of a prior art technique to improve the linearity in a low noise amplifier (LNA) with a differential feedback-transformer.
Figure 2:
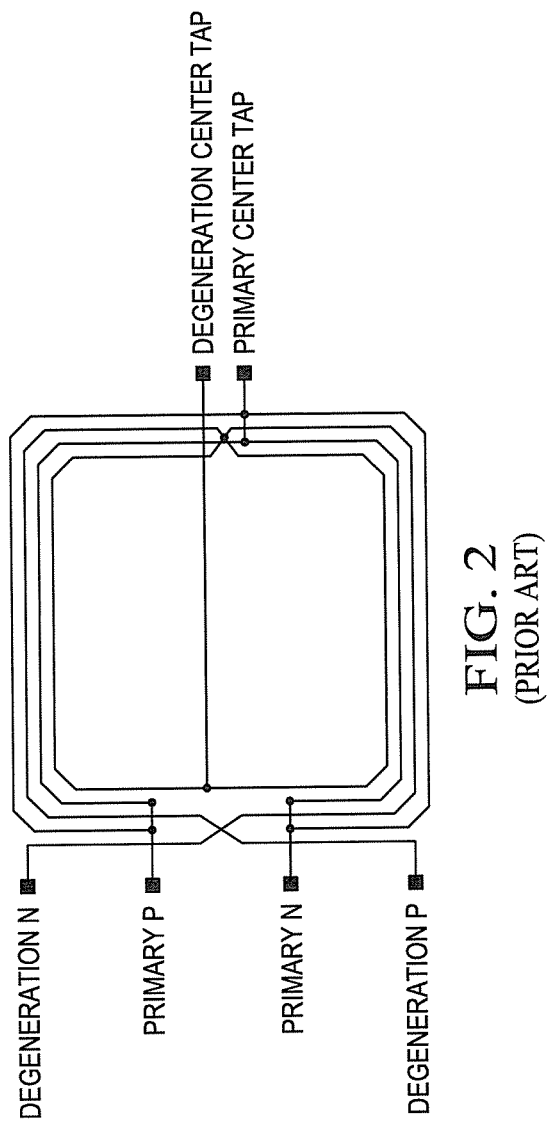
FIG. 2 illustrates a simplified physical layout of the prior art differential feedback-transformer of FIG. 1.

In contrast, the prior art circuit 100 of FIG. 1 only has coupling between its primary inductors 102a and 102b and its degeneration inductors 104a and 104b, respectively.

N-channel transistor 412 has its source coupled through the degeneration inductor 408 to the negative power supply rail (e.g. ground). An N-channel transistor 414 has its source coupled through the degeneration inductor 410 to the negative power supply rail (e.g. ground). Note that the polarity of degeneration inductors 408 and 410 are reversed with respect to the coupling of the sources of transistors 412 and 414 to the negative supply rail.

The gate of transistor 412 is coupled to one end of resistor 416 and through AC coupling capacitor 418 to a signal source 420P. Similarly, the gate of transistor 414 is coupled to one end of resistor 422 and through AC coupling capacitor 424 to a signal source 420N. In an embodiment, the signal source (420P-420N) is an output from a mixer.

The drains of transistors 412 and 414 are coupled to the sources of N-channel transistors 426 and 428, respectively. The gates of N-channel transistors 426 and 428 are respectively coupled to bias voltage 430a and 430b. The drains of transistors 426 and 428 are respectively coupled through first primary inductor 402 and second primary inductor 404 to the positive supply rail (e.g. $V_{dd}$). Note that the polarity of primary inductor 402 and 404 are reversed with respect to the coupling of the drains of transistors 426 and 428 to the positive supply rail.

A first current source 432 is coupled to the drain and gate of N-channel transistor 434 and to the opposite end of resistor 416. A second current source 436 is coupled to the drain and gate of N-channel transistor 438 and to the opposite end of resistor 422. Since the drain and gate of N-channel transistors 434 and 438 are respectively coupled together, transistors 434 and 438 operate as a forward-biased diode providing a constant bias voltage at the end of resistors 416 and 422, respectively.

Resistor 440 is coupled between the negative supply rail and a first end of the secondary inductor 406. The second end of secondary inductor 406 is coupled to the negative supply rail. A single ended out voltage is obtained across resistor 440.

Figure 5:
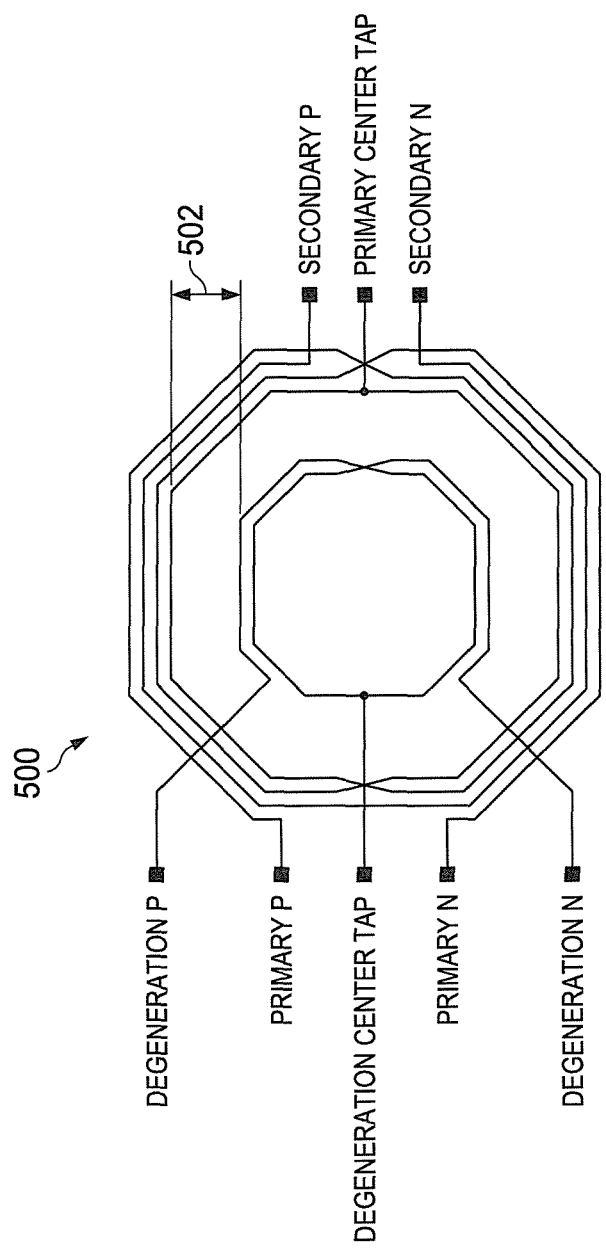
FIG. 5 illustrates a simplified layout of the feedback balun transformer depicted in FIG. 4, in accordance with the principles of the present disclosure.

Reference is now made to FIG. 5 that illustrates a simplified layout for the feedback balun transformer 500. The degeneration inductors (408 and 410 in FIG. 4) are integrated within intertwined primary and secondary inductors (402, 404 and 406 in FIG. 4) thereby providing a wider range of degeneration that can be independently adjusted with either the number of turns for the degeneration inductors and/or the distance from the degeneration inductors to intertwined primary and secondary inductors. The magnitude of degeneration is controlled by the value of degeneration inductance itself and the coupling coefficient (i.e. distance 502) between primary inductors and the degeneration inductors. In addition, the differential to single-ended conversion takes place by coupling primary inductors 402 and 404 to the secondary inductor 406 and taking $V_{out}$ across resistor 440.

Figure 6:
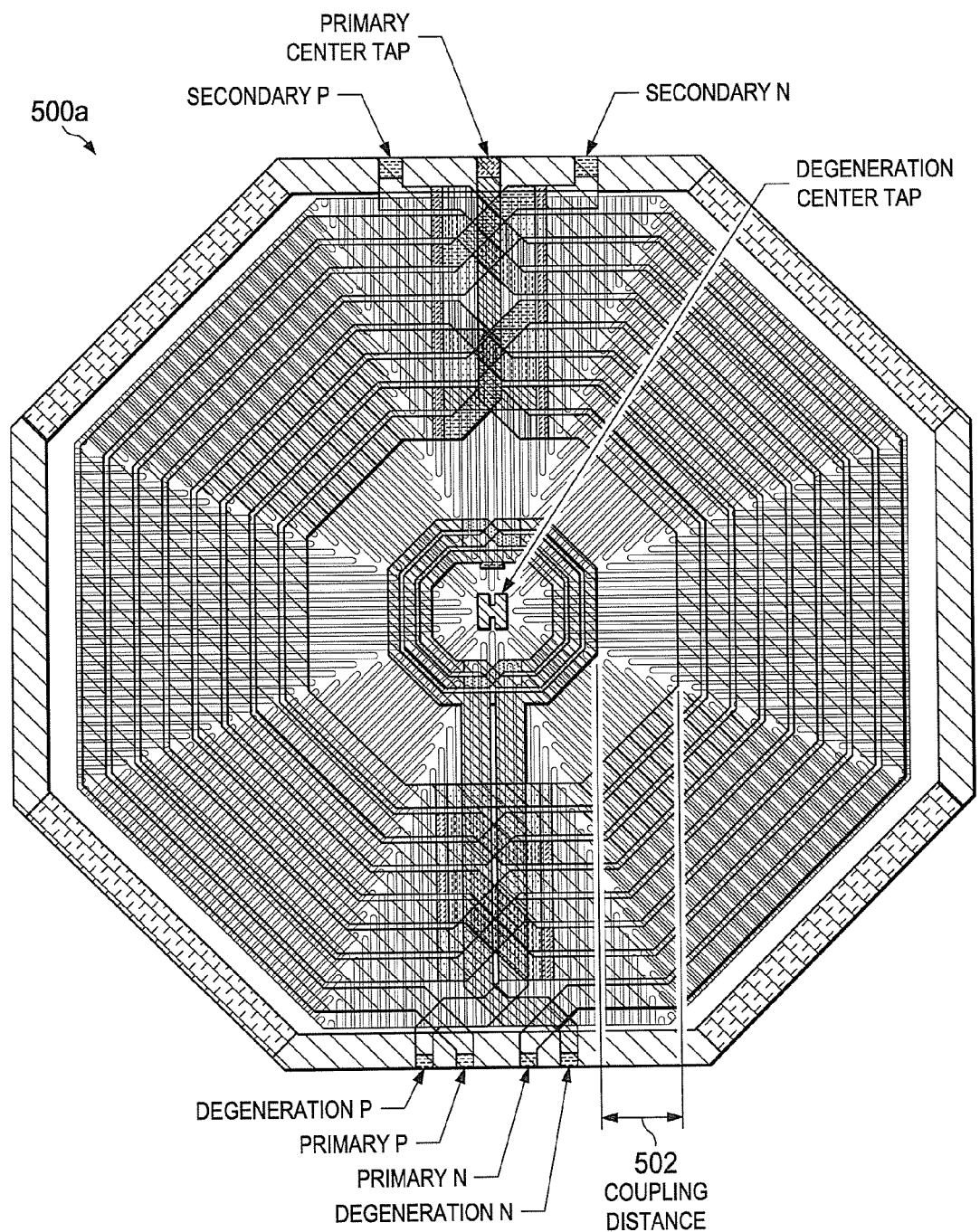
FIG. 6 illustrates a layout of the feedback balun transformer depicted in FIG. 4 with minimum electro-magnetic coupling.
Figure 7:
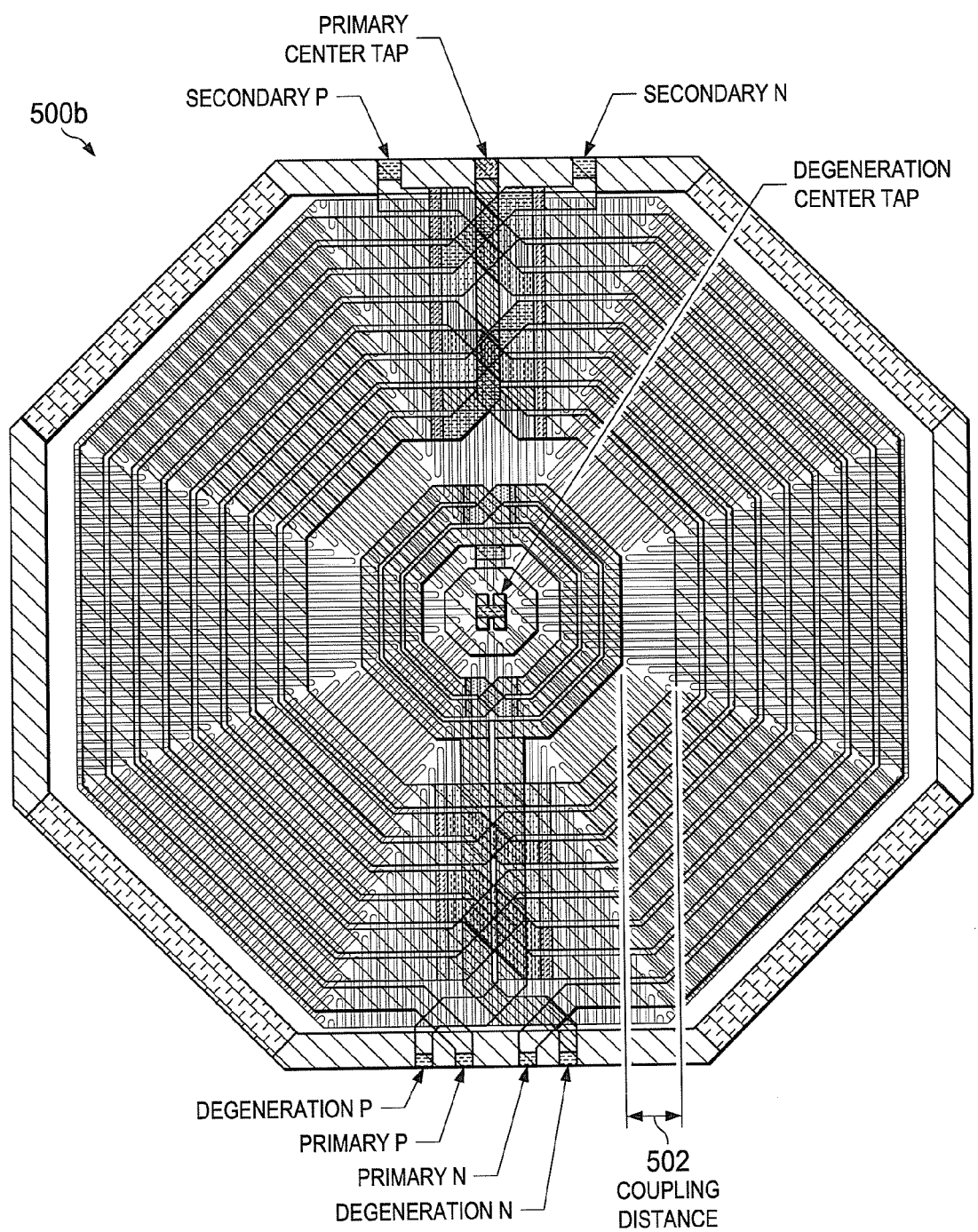
FIG. 7 illustrates a layout of the feedback balun transformer depicted in FIG. 4 with optimum electro-magnetic coupling.
Figure 8:
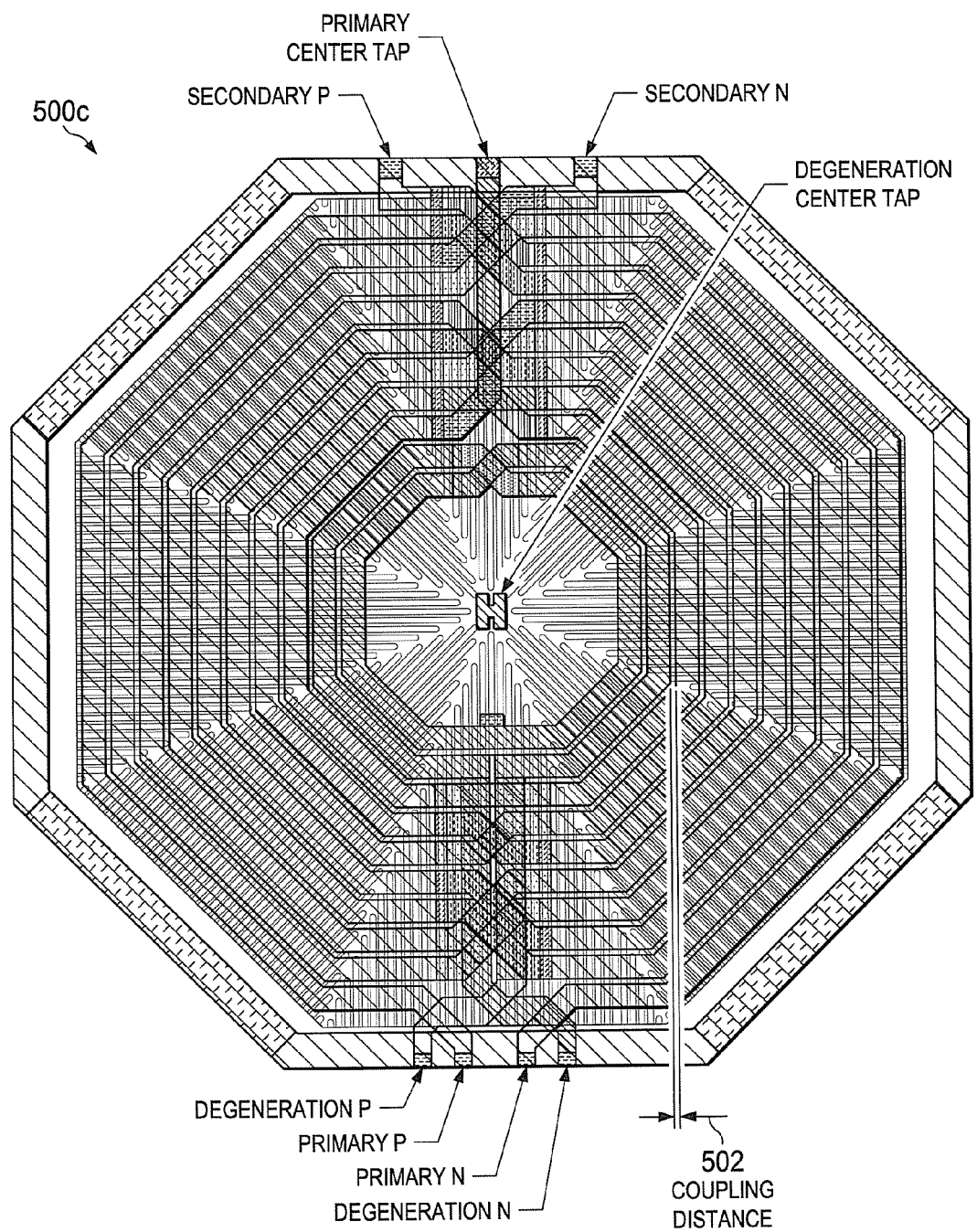
FIG. 8 illustrates a layout of the feedback balun transformer depicted in FIG. 4 with maximum electro-magnetic coupling.

Referring now to FIGS. 6, 7 and 8, a layout is illustrated for a feedback balun transformer 500 with minimum electro-magnetic coupling (farthest distance) 500a, optimum electro-magnetic coupling (optimum distance) 500b, and maximum electro-magnetic coupling (closest distance) 500c, respectively. Applicants simulated the feedback-balun-transformer 500a-500c depicted in FIGS. 6-8 assuming fabrication in a 40 nm process from the Semiconductor Manufacturing International Corporation (SMIC), of China. The performance parameters of the three feedback-balun-transformers depicted in FIGS. 6, 7 and 8 with different degeneration magnitude through distance control 502 between primary and degeneration inductors are depicted in Table 2 below.

TABLE 2

Performance Parameters Of Three Feedback-Balun-Transformers With Different Distances

| Parameter | FIG. 6 Minimum coupling | FIG. 7 Optimum coupling | FIG. 8 Maximum coupling |
|---|---|---|---|
| $L_p$(H) | 9.36n | 9.28n | 9.16n |
| $L_s$(H) | 3.54n | 3.51n | 3.44n |
| $L_d$(H) | 0.88n | 0.89n | 0.89n |
| $Q_p$ | 13.05 | 11.91 | 10.49 |
| $Q_s$ | 4.06 | 3.91 | 3.66 |
| $Q_d$ | 4.96 | 5.05 | 6.95 |
| S21(dB)[1] | −3.66 | −3.72 | −3.88 |
| S31(dB)[1] | −22.75 | −19.91 | −15.04 |
| S32(dB)[1] | −26.80 | −23.96 | −18.72 |

[1]1=primary, 2=secondary, 3=degeneration

Figure 9:
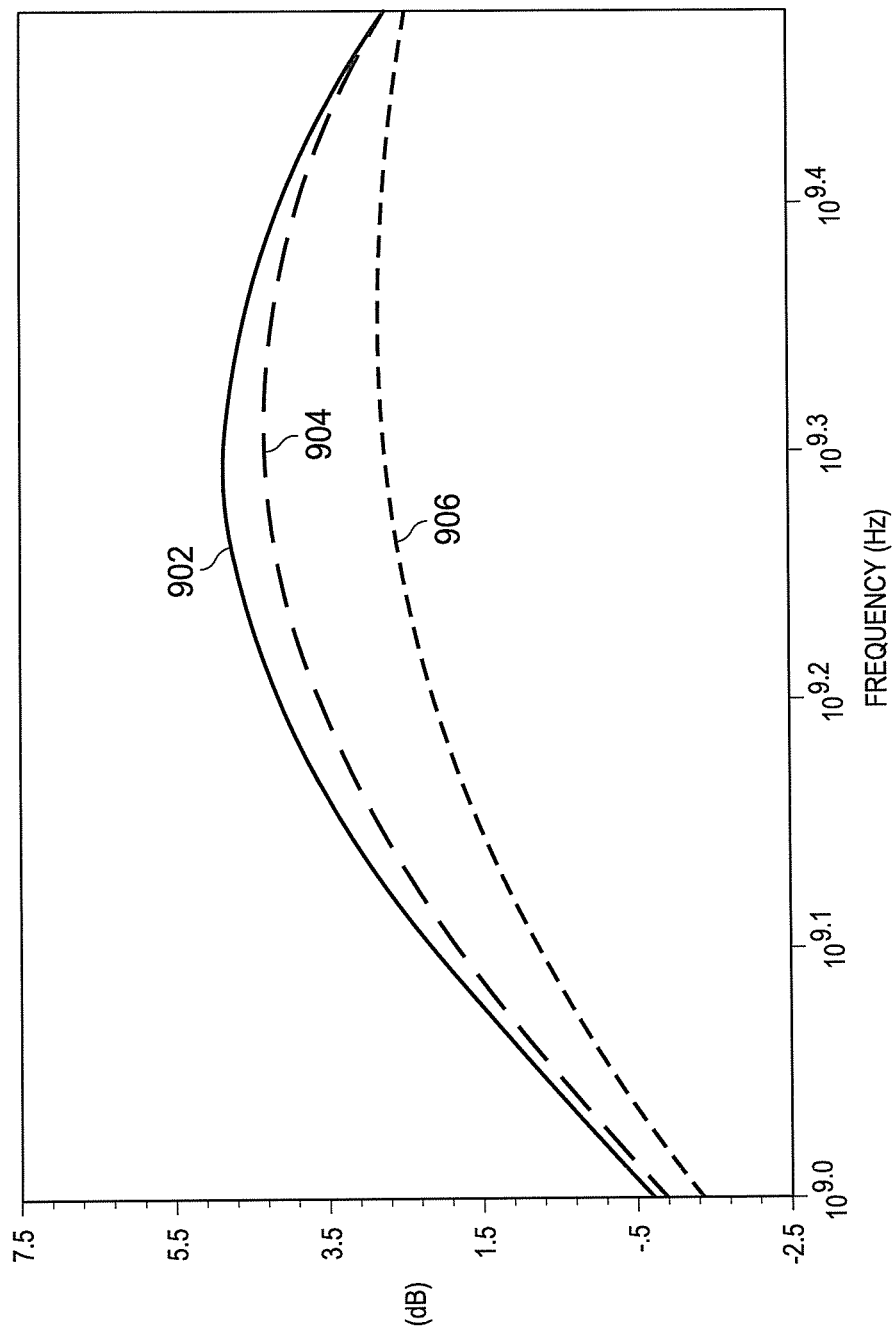
FIG. 9 illustrates a graph of AC simulation results for the circuit of FIG. 4 using the feedback balun transformers of FIGS. 6-8.

Referring now to FIG. 9, a graph of AC simulation results are illustrated for the circuit of FIG. 4 using the feedback balun transformers 500a-500c of FIGS. 6-8. The AC simulation results depicted in FIG. 9 illustrate that the gain is largest for the minimum coupling transformer 500a and smallest for the maximum coupling transformer 500c. The simulation confirms the controllability of degeneration magnitude through coupling coefficient (distance) between primary and degeneration inductors although the degeneration inductance (Ld) was same for all three transformers. The more electro-magnetic coupling, the more negative feedback which translates into better linearity and less output power. Therefore, the minimum coupling means worst linearity and maximum output power whereas maximum coupling means best linearity and minimum output power. The optimum coupling transformer 500b provides the best performance tradeoffs for linearity and gain perspectives.

Modern integrated circuit design and manufacturing are commonly automated with Electronic Design Automation (EDA) tools. Exemplary but not exclusive tools may be found from companies such as, but not limited to, Synopsys, Cadence, and Mentor Graphics. The details of these EDA tools are not required for the present disclosure.

Figure 10:
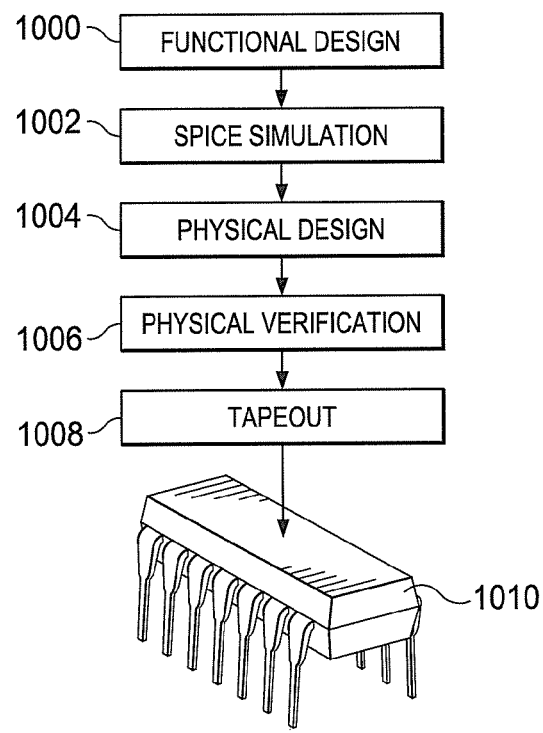
FIG. 10 illustrates a simplified ASIC design flow employing EDA tools for producing ASICs having embodiments of the present disclosure.

Reference is now made to FIG. 10 illustrating a simplified general ASIC design flow employing (EDA) tools for producing ASICs having embodiments of the present disclosure. At step 1000, the functional design of an ASIC which may include the circuits of amplifier 300 or amplifier 400, is created. For those portions of the ASIC digital in nature, the functional design is typically manifested by writing Register Transfer Level (RTL) code in a Hardware Descriptive Language (HDL) such as but not limited to, VHDL or Verilog. A functional verification (behavioral simulation) is then preferably performed on the HDL data structures to ensure the RTL design is in accordance with the logic specifications. Alternatively, a schematic of the digital logic can be captured with a schematic capture program.

For portions of the ASIC that are analog in nature (such as circuits 300 and 400 of the present disclosure), the analog functional design is typically manifested by capturing a schematic with a schematic capture program. The output of the schematic capture program is then converted (synthesized) into gate/transistor level netlist data structures.

At step 1002, the data structures are simulated with a simulation program with integrated circuits emphasis (SPICE). At step 1004, the data structures from step 1002 are instantiated with their geometric representations and the physical layout of the ASIC is performed.

The first step in physical layout is typically so-called "floor-planning" wherein gross regions on the integrated circuit chip are assigned and input/output (I/O) pins are defined. Hard cores (e.g. arrays, analog blocks, inductors, etc.) are placed within the gross regions based on the design constraints (e.g. trace lengths, timing etc.). Clock wiring (commonly referred to as clock trees) are placed and connections between gates/analog blocks are routed. When all the elements are placed, a global and detailed routing is running to connect all the elements together. Post-wiring optimization is preferably performed to improve performance (timing closure), noise (signal integrity), and yield. The layout is modified, where possible, while maintaining compliance with the design rules set by the captive or external semiconductor manufacturing foundry of choice, to make it more efficient to produce. Such modifications may include adding extra vias or dummy metal/diffusion/poly layers.

At step 1006, the physical designed is verified. Design rule checking (DRC) is performed to determine whether the physical layout of the ASIC satisfies a series of recommended parameters i.e. design rules of the foundry. The design rules are a series of parameters provided by the foundry that are specific to a particular semiconductor manufacturing process. The design rules specify certain geometric and connectivity restrictions to ensure sufficient margins to account for variability in semiconductor manufacturing processes, to ensure that the ASICs work correctly. A layout versus schematic (LVS) check is preferably performed to verify the physical layout corresponds to the original schematic or circuit diagram of the design. A complete simulation is then preferably performed to ensure the layout phase is properly done.

After the layout is verified in step 1006, mask generation design data typically in the form of GDSII data structures is said to "tapeout" for preparation of photomasks at step 1008. The GDSII data structures are transferred through a communications medium (e.g. storage or over a network) from the circuit designer to either a photomask supplier/maker or directly to the semiconductor foundry.

At step 1010, the photomasks are created and used to manufacture ASICs in accordance with principles of the present disclosure.

Some of the techniques described herein can be implemented by software stored on one or more computer readable storage medium and executed on a computer. The selected techniques could be executed on a single computer or a computer networked with another computer or computers. For clarity, only those aspects of the tools or computer germane to the disclosed techniques are described. Product details well known in the art may be omitted.

Figure 11:
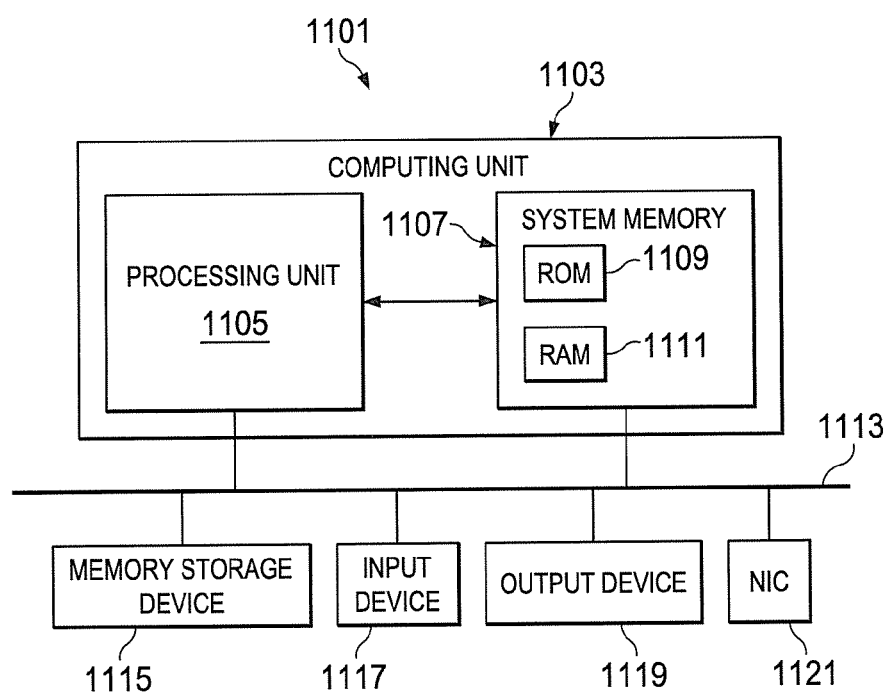
FIG. 11 illustrates an example of a computing device for practicing the design flow of FIG. 10.

FIG. 11 shows an illustrative example of a computing device 1101 for practicing the design flow of FIG. 10. As seen in FIG. 11, the computing device 1101 includes a computing unit 1103 with a processing unit 1105 and a system memory 1107. The processing unit 1105 may be any type of programmable electronic device for executing software instructions, but will conventionally be a microprocessor. The system memory 1107 may include both a read-only memory (ROM) 1109 and a random access memory (RAM) 1111. As will be appreciated by those of ordinary skill in the art, both the read-only memory 1109 and the random access memory 1111 may store software instructions for execution by the processing unit 1105.

The processing unit 1105 and the system memory 1107 are connected, either directly or indirectly, through a bus 1113 or alternate communication structure, to one or more peripheral devices. For example, the processing unit 1105 or the system memory 1107 may be directly or indirectly connected to one or more additional memory storage devices 1115. The memory storage devices 1115 may include, for example, a "hard" magnetic disk drive, a solid state disk drive, an optical disk drive, and a removable disk drive. The processing unit 1105 and the system memory 1107 also may be directly or indirectly connected to one or more input devices 1117 and one or more output devices 1119. The input devices 1117 may include, for example, a keyboard, a pointing device (such as a mouse, touchpad, stylus, trackball, or joystick), a scanner, a camera, and a microphone. The output devices 1119 may include, for example, a display device, a printer and speakers. With various examples of the computing device 1101, one or more of the peripheral devices 1115-1119 may be internally housed with the computing unit 1103. Alternately, one or more of the peripheral devices 1115-1119 may be external to the housing for the computing unit 1103 and connected to the bus 1113 through, for example, a Universal Serial Bus (USB) connection or a digital visual interface (DVI) connection.

With some implementations, the computing unit 1103 may also be directly or indirectly connected to one or more network interfaces cards (NIC) 1121, for communicating with other devices making up a network. The network interface cards 1121 translate data and control signals from the computing unit 1103 into network messages according to one or more communication protocols, such as the transmission control protocol (TCP) and the Internet protocol (IP). Also, the network interface cards 1121 may employ any suitable connection agent (or combination of agents) for connecting to a network, including, for example, a wireless transceiver, a modem, or an Ethernet connection.

It should be appreciated that the computing device 1101 is illustrated as an example only, and it not intended to be limiting. Various embodiments of the invention may be implemented using one or more computing devices that include the components of the computing device 1101 illustrated in FIG. 11, or which include an alternate combination of components, including components that are not shown in FIG. 11. For example, various embodiments of the invention may be implemented using a multi-processor computer, a plurality of single and/or multiprocessor computers arranged into a network, or some combination of both.

Figure 12:
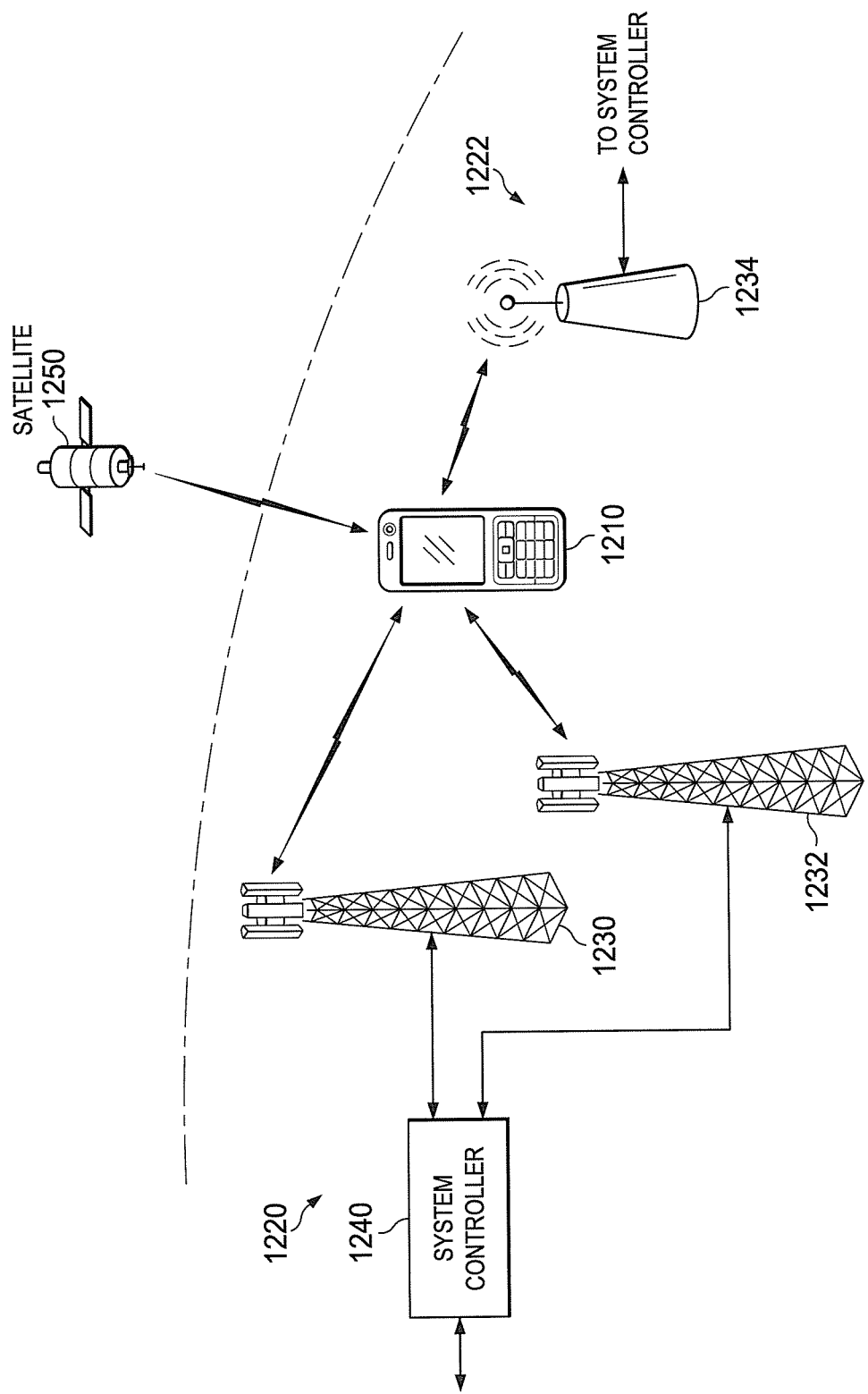
FIG. 12 illustrates a wireless device that may have embodiments of the present disclosure, communicating with wireless systems; and, FIG. 13 illustrates a block diagram of the wireless device in FIG. 12.

FIG. 12 illustrates a wireless device 1210 that may have embodiments of the present disclosure, communicating with wireless systems 1220 and 1222. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Time Division Synchronous CDMA (TD-SCDMA), or some other version of CDMA. For simplicity, FIG. 12 illustrates wireless system 1220 including two base stations 1230 and 1232 and one system controller 1240, and wireless system 1222 including one base station 1234. In general, a wireless system may include any number of base stations and any set of network entities. A base station may also be referred to as a Node B, an evolved Node B (eNB), an access point, etc.

Wireless device 1210 may also be referred to as user equipment (UE), a mobile station, a terminal, an access terminal, a subscriber unit, a station, etc. Wireless device 1210 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 1210 may communicate with wireless system 1220 and/or 1222. Wireless device 1210 may also receive signals from broadcast stations, signals from satellites (e.g., a satellite 1250) in one or more global navigation satellite systems (GNSS), etc. Wireless device 110 may support one or more radio technologies for wireless communication such as LTE, WCDMA, CDMA 1×, TD-SCDMA, GSM, 802.11, etc.

Figure 13:
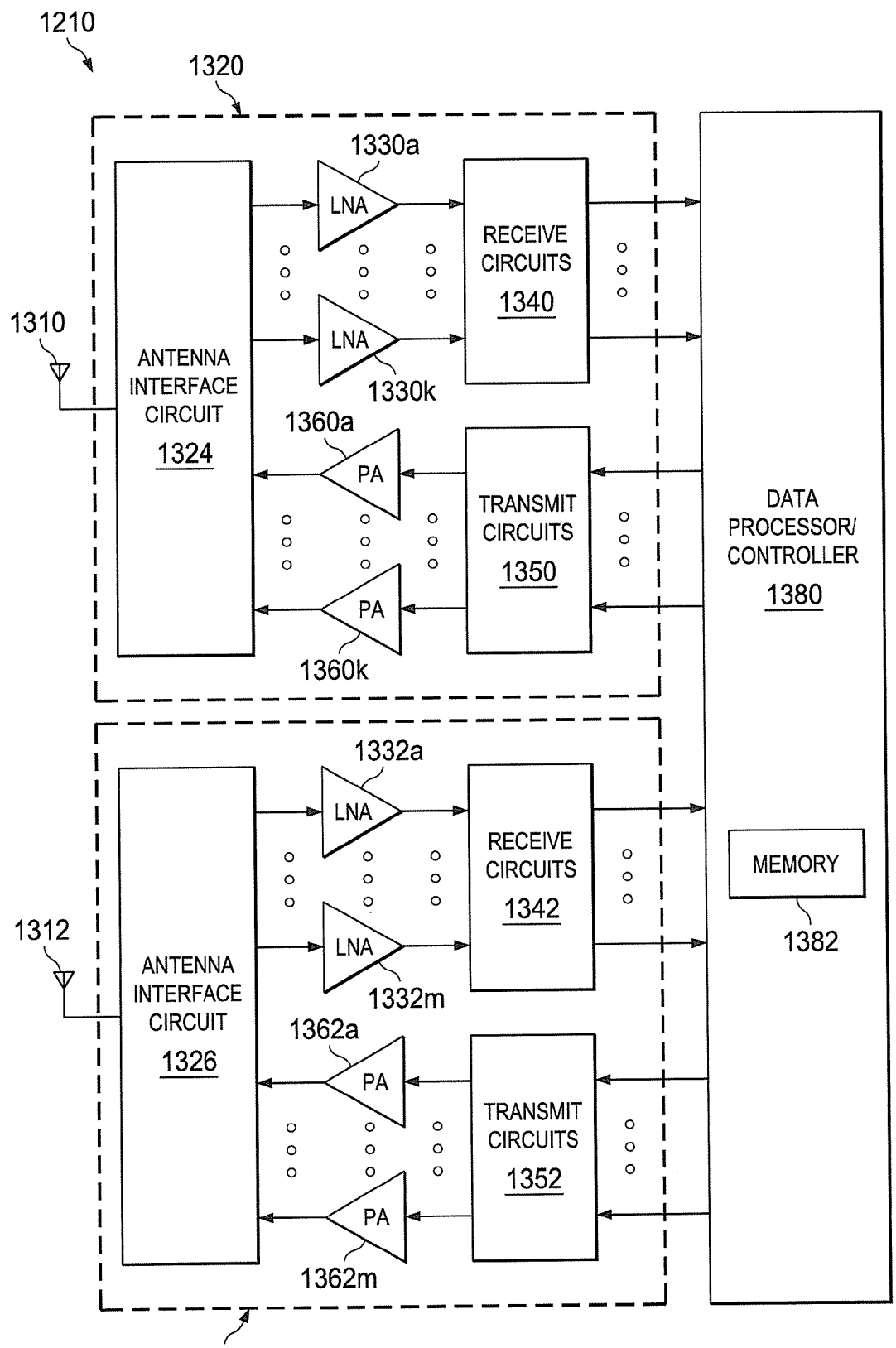

FIG. 13 illustrates a block diagram of an exemplary design of wireless device 1210 in FIG. 12. In this exemplary design, wireless device 1210 includes a transceiver 1320 coupled to a primary antenna 1310, a transceiver 1322 coupled to a secondary antenna 1312, and a data processor/controller 1380. Transceiver 1320 includes an antenna interface circuit 1324, multiple (K) LNAs 1330a to 1330k, receive circuits 1340, transmit circuits 1350, and multiple (K) power amplifiers (PAs) 1360a to 1360k. Transceiver 1322 includes an antenna interface circuit 1326, multiple (M) LNAs 1332a to 1332m, receive circuits 1342, transmit circuits 1352, and multiple (M) PAs 1362a to 1362m. Transceivers 1320 and 1322 may support multiple frequency bands, carrier aggregation, multiple radio technologies, multiple wireless systems, receive diversity, transmit diversity, MIMO transmission from multiple transmit antennas to multiple receive antennas, etc., or any combination thereof.

For data reception, antenna 1310 receives signals from base stations and/or other transmitter stations and provides a received RF signal to antenna interface circuit 1324. Antenna interface circuit 1324 provides one or more input RF signals to one or more selected LNAs 1330. Antenna interface circuit 1324 may include switches, duplexers, diplexers, transmit filters, receive filters, matching circuits, directional couplers, etc. Each selected LNA 1330 amplifies its input RF signal and provides one or more amplified RF signals to receive circuits 1340. Receive circuits 1340 down-convert each amplified RF signal from RF to baseband, filter and amplify the down-converted signal, and provide an input baseband signal to data processor 1380. Receive circuits 1340 may include mixers, filters, amplifiers, matching circuits, oscillators, LO generators, phase locked loops (PLLs), etc.

For data transmission, data processor 1380 processes (e.g., encodes and modulates) data to be transmitted and provides one or more output baseband signals to transmit circuits 1350. Transmit circuits 1350 amplify, filter, and up-convert each output baseband signal from baseband to RF and provide a resultant modulated signal to a selected PA 1360. Transmit circuits 1350 may include amplifiers, filters, mixers, matching circuits, oscillators, LO generators, PLLs, etc. Each selected PA 1360 amplifies its modulated signal and provides an output RF signal having the proper transmit power level. The output RF signal from each selected PA 1360 is routed through antenna interface circuit 1324 and transmitted via antenna 1310.

LNAs 1332, receive circuits 1342, transmit circuits 1352, and PAs 1362 within transceiver 1322 may operate in similar manner as LNAs 1330, receive circuits 1340, transmit circuits 1350, and PAs 1360 within transceiver 1320. Transceivers 1320 and 1322 may include other circuits not shown in FIG. 13. All or a portion of transceivers 1320 and 1322 may be implemented on one or more analog integrated circuits (ICs), RF ICs (RFICs), mixed-signal ICs, etc. For example, LNAs 1330 and receive circuits 1340 may be implemented on one module, which may be an RFIC, etc. The circuits in transceivers 1320 and 1322 may also be implemented in other manners.

Data processor/controller 1380 may perform various functions for wireless device 1210. For example, data processor 1380 may perform processing for data being received via receiver circuits 1340 and 1342 and data being transmitted via transmit circuits 1350 and 1352. Controller 1380 may control the operation of various circuits within transceivers 1320 and 1322. A memory 1382 may store program codes and data for data processor/controller 1380. Data processor/controller 1380 may be implemented on one or more application specific integrated circuits (ASICs) and/or other ICs.

FIG. 13 illustrates an exemplary design of wireless device 1210 with two transceivers 1320 and 1322 coupled to two antennas 1310 and 1312. In general, a wireless device may include any number of transceivers for any number of antennas. Each transceiver may include any number of LNAs and any number of PAs to support any number of frequency bands, any number of wireless systems, any number of radio technologies, etc.

Although features and elements are described above in particular combinations, each feature or element can be used alone without the other features and elements or in various combinations with or without other features and elements. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

While this disclosure has described certain embodiments and generally associated methods, alterations and pet mutations of these embodiments and methods will be apparent to those skilled in the art. The present disclosure has application to virtually all communications systems. For example, it may be used in cellular transceivers, 2-way radio communications, Wi-Fi applications, satellite receivers, and any application that uses a variable gain amplifier. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a transconductance amplifier comprising:
   a first N-channel transistor having a source coupled through a first degeneration inductor to a negative power supply rail, and a gate coupled to one end of a first resistor and directly through a first AC coupling capacitor to a signal source; and
   a second N-channel transistor having a source coupled through a second degeneration inductor to the negative power supply rail, and a gate coupled to one end of a second resistor and directly through a second AC coupling capacitor to the signal source; and
   a feedback-balun-transformer having primary inductors and secondary inductors, the feedback-balun-transformer coupled to the transconductance amplifier and configured to:
   provide electro-magnetic coupling between the primary inductors, the secondary inductors, and the degeneration inductors; and
   provide a differential to single-ended output.

2. The apparatus of claim 1, wherein the electro-magnetic coupling is between:
a first primary inductor, a second primary inductor, and a secondary inductor;
the first primary inductor and a first degeneration inductor;
the second primary inductor and a second degeneration inductor; and
the first degeneration inductor, the second degeneration inductor and the secondary inductor.

3. The apparatus of claim 1, wherein the degeneration inductors are integrated within intertwined primary and secondary inductors thereby providing a wider range of degeneration independently adjustable with a number of degeneration inductor turns.

4. The apparatus of claim 1, wherein the degeneration inductors are integrated within intertwined primary and secondary inductors thereby providing a wider range of degeneration independently adjustable with a distance from the degeneration inductors to intertwined primary and secondary inductors.

5. The apparatus of claim 1, wherein the degeneration inductors are integrated within intertwined primary and secondary inductors thereby providing a wider range of degeneration independently adjustable with a number of degeneration inductor turns and a distance from the degeneration inductors to intertwined primary and secondary inductors.

6. The apparatus of claim 2, wherein the transconductance amplifier further comprises:
a third and a fourth N-channel transistor each having a source, a gate, and a drain, the first and second N-channel transistors having drains respectively coupled to the sources of the third and a fourth N-channel transistors, the gates of the third and fourth N-channel transistors respectively coupled to a bias voltage, the drains of the third and the fourth N-channel transistors coupled to a positive supply rail through the first primary inductor and the second primary inductor, respectively.

7. The apparatus of claim 6, wherein the transconductance amplifier further comprises:
a first current source coupled to a drain and a gate of a fifth N-channel transistor and to an opposite end of the first resistor;
a second current source coupled to a drain and a gate of a sixth N-channel transistor and to the opposite end of the second resistor; and
a third resistor coupled between the negative power supply rail and a first end of a first secondary inductor, a second end of the first secondary inductor coupled to the negative power supply rail.

8. A method comprising:
by a feedback-balun-transformer having primary inductors and secondary inductors, the feedback-balun-transformer coupled to a transconductance amplifier that comprises a first N-channel transistor and a second N-channel transistor, the first N-channel transistor having a source coupled through a first degeneration inductor to a negative power supply rail and a gate coupled to one end of a first resistor and directly through a first AC coupling capacitor to a signal source, the second N-channel transistor having a source coupled through a second degeneration inductor to the negative power supply rail and a gate coupled to one end of a second resistor and directly through a second AC coupling capacitor to the signal source, providing electro-magnetic coupling between the primary inductors, the secondary inductors, and the degeneration inductors; and
providing a differential to single-ended conversion output.

9. A non-transitory computer-readable medium for use with a computer having software for creating integrated circuits, the computer-readable medium having stored thereon one or more computer-readable data structures having photomask data for making an apparatus, the apparatus comprising:
a transconductance amplifier comprising:
a first N-channel transistor having a source coupled through a first degeneration inductor to a negative power supply rail, and a gate coupled to one end of a first resistor and directly through a first AC coupling capacitor to a signal source; and
a second N-channel transistor having a source coupled through a second degeneration inductor to the negative power supply rail, and a gate coupled to one end of a second resistor and directly through a second AC coupling capacitor to the signal source; and
a feedback-balun-transformer having primary inductors and secondary inductors, the feedback-balun-transformer coupled to the transconductance amplifier and configured to:
provide electro-magnetic coupling between the primary inductors, the secondary inductors, and the degeneration inductors; and
provide differential to single-ended conversion.

10. The non-transitory computer-readable medium of claim 9, wherein the electro-magnetic coupling is between:
a first primary inductor, a second primary inductor, and a secondary inductor;
the first primary inductor and a first degeneration inductor;
the second primary inductor and a second degeneration inductor; and
the first degeneration inductor, the second degeneration inductor and the secondary inductor.

11. The non-transitory computer-readable medium of claim 9, wherein the degeneration inductors are integrated within intertwined primary and secondary inductors thereby providing a wider range of degeneration independently adjustable with a number of degeneration inductor turns.

12. The non-transitory computer-readable medium of claim 9, wherein the degeneration inductors are integrated within intertwined primary and secondary inductors thereby providing a wider range of degeneration independently adjustable with a distance from the degeneration inductors to intertwined primary and secondary inductors.

13. The non-transitory computer-readable medium of claim 9, wherein the degeneration inductors are integrated within intertwined primary and secondary inductors thereby providing a wider range of degeneration independently adjustable with a number of degeneration inductor turns and a distance from the degeneration inductors to intertwined primary and secondary inductors.

14. The non-transitory computer-readable medium of claim 10, wherein the transconductance amplifier further comprises:
a third and a fourth N-channel transistor each having a source, a gate, and a drain, the first and second N-channel transistors having drains respectively coupled to the sources of the third and a fourth N-channel transistors, the gates of the third and fourth N-channel transistors respectively coupled to a bias voltage, the drains of the third and the fourth N-channel transistors coupled to a positive supply rail through the first primary inductor and the second primary inductor, respectively.

15. The non-transitory computer-readable medium of claim 14, wherein the transconductance amplifier further comprises:
- a first current source coupled to a drain and a gate of a fifth N-channel transistor and to an opposite end of the first resistor;
- a second current source coupled to a drain and a gate of a sixth N-channel transistor and to the opposite end of the second resistor; and
- a third resistor coupled between the negative power supply rail and a first end of Ma a first secondary inductor, a second end of the first secondary inductor coupled to the negative power supply rail.

* * * * *

UNITED STATES PATENT AND TRADEMARK OFFICE
CERTIFICATE OF CORRECTION

PATENT NO. : 9,608,568 B2
APPLICATION NO. : 14/638874
DATED : March 28, 2017
INVENTOR(S) : Ro et al.

It is certified that error appears in the above-identified patent and that said Letters Patent is hereby corrected as shown below:

In the Specification

In Column 9, Line 11, delete "110" and insert --1210-- therefor

In Column 10, Line 35-36, delete "pet mutations" and insert --permutations-- therefor In the Claims In Column 13, Line 13, in Claim 15, after "of", delete "Ma"

Signed and Sealed this
Eighteenth Day of September, 2018

Andrei Iancu
*Director of the United States Patent and Trademark Office*